(12) United States Patent
Friedrich et al.

(10) Patent No.: US 11,976,996 B2
(45) Date of Patent: May 7, 2024

(54) MICROMECHANICAL COMPONENT FOR A CAPACITIVE PRESSURE SENSOR DEVICE

(71) Applicant: Robert Bosch GmbH, Stuttgart (DE)

(72) Inventors: Thomas Friedrich, Moessingen-Oeschingen (DE); Christoph Hermes, Kirchentellinsfurt (DE); Hans Artmann, Boeblingen-Dagersheim (DE); Heribert Weber, Nuertingen (DE); Peter Schmollngruber, Aidlingen (DE); Volkmar Senz, Metzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 494 days.

(21) Appl. No.: 17/282,736

(22) PCT Filed: Dec. 18, 2019

(86) PCT No.: PCT/EP2019/085943
§ 371 (c)(1),
(2) Date: Apr. 2, 2021

(87) PCT Pub. No.: WO2020/127477
PCT Pub. Date: Jun. 25, 2020

(65) Prior Publication Data
US 2022/0003621 A1 Jan. 6, 2022

(30) Foreign Application Priority Data
Dec. 21, 2018 (DE) .................. 102018222719.5

(51) Int. Cl.
*B81B 7/02* (2006.01)
*G01L 7/08* (2006.01)
*G01L 9/00* (2006.01)

(52) U.S. Cl.
CPC ............. *G01L 9/0073* (2013.01); *B81B 7/02* (2013.01); *G01L 7/082* (2013.01); *G01L 9/0048* (2013.01); *B81B 2201/0264* (2013.01)

(58) Field of Classification Search
CPC .... B81B 2201/0264; B81B 2203/0127; B81B 2203/0118; B81B 3/007; G01L 7/082; G01L 9/0048; G01L 9/0042; G01L 9/0047
See application file for complete search history.

(56) References Cited

U.S. PATENT DOCUMENTS

| | | | | |
|---|---|---|---|---|
| 6,122,973 A | * | 9/2000 | Nomura | ................ G01L 9/0075 361/283.4 |
| 2013/0068022 A1 | * | 3/2013 | Jeung | ...................... G01P 15/14 73/702 |
| 2014/0352445 A1 | | 12/2014 | Kuisma | |

FOREIGN PATENT DOCUMENTS

| | | |
|---|---|---|
| CN | 101087999 A | 12/2007 |
| CN | 105293418 A | 2/2016 |

(Continued)

OTHER PUBLICATIONS

International Search Report for PCT/EP2019/085943 dated Mar. 26, 2020.

*Primary Examiner* — Laura M Menz
*Assistant Examiner* — Candice Chan
(74) *Attorney, Agent, or Firm* — NORTON ROSE FULBRIGHT US LLP; Gerard A. Messina

(57) ABSTRACT

A micromechanical component for a capacitive pressure sensor device, including a diaphragm that is stretched with the aid of a frame structure in such a way that a cantilevered area of the diaphragm spans a framed partial surface, and including a reinforcement structure that is formed at the cantilevered area. A first spatial direction oriented in parallel to the framed partial surface is definable in which the (Continued)

cantilevered area has a minimal extension, and a second spatial direction oriented in parallel to the framed partial surface and oriented perpendicularly with respect to the first spatial direction is definable in which the cantilevered area has a greater extension. The reinforcement structure is present at a first distance from the frame structure in the first spatial direction, and at a second distance in the second spatial direction, the second distance being greater than the first distance.

5 Claims, 7 Drawing Sheets

(56) References Cited

FOREIGN PATENT DOCUMENTS

| | | |
|---|---|---|
| CN | 105940287 A | 9/2016 |
| DE | 102005029802 A1 | 1/2007 |
| DE | 102007029414 A1 | 1/2009 |
| DE | 102009000403 A1 | 7/2010 |
| DE | 102011083070 A1 | 3/2013 |
| DE | 102013209385 A1 | 11/2014 |
| DE | 102013213065 A1 | 1/2015 |
| WO | 2010016094 A1 | 2/2010 |
| WO | 2018041498 A1 | 3/2018 |

* cited by examiner

MICROMECHANICAL COMPONENT FOR A CAPACITIVE PRESSURE SENSOR DEVICE

FIELD

The present invention relates to a micromechanical component for a capacitive pressure sensor device, and a capacitive pressure sensor device. Moreover, the present invention relates to a manufacturing method for a micromechanical component for a capacitive pressure sensor device, and a method for manufacturing a capacitive pressure sensor device.

BACKGROUND INFORMATION

German Patent Application No. DE 10 2009 000 403 A1 describes a capacitive pressure sensor that includes a substrate, an intermediate layer applied to one side of the substrate, a frame structure that frames a partial surface of the intermediate layer, and a diaphragm that is stretched with the aid of the frame structure. A cantilevered area of the diaphragm spans the framed partial surface. A reinforcement structure is formed at an inner side of the cantilevered area, oriented toward the framed partial surface; a counter electrode is fastened to the reinforcement structure in such a way that a distance between the counter electrode and a measuring electrode situated on the framed partial surface varies during a pressure-induced deformation of the cantilevered area. The reinforcement structure is formed at the inner surface of the cantilevered area, centrally with respect to the frame structure.

SUMMARY

The present invention provides a micromechanical component for a capacitive pressure sensor device, a capacitive pressure sensor device, a manufacturing method for a micromechanical component for a capacitive pressure sensor device, and a method for manufacturing a capacitive pressure sensor device.

In accordance with an example embodiment of the present invention, micromechanical components for a capacitive pressure sensor device or capacitive pressure sensor devices are provided, in which a cantilevered area of a diaphragm that is stretched with the aid of a frame structure has an improved deformability due to the second distance of the reinforcement structure from the frame structure in the second spatial direction being greater than the first distance of the reinforcement structure from the frame structure in the first spatial direction. The present invention takes into account that, while a deformation of a middle area of the cantilevered area is generally undesirable and therefore is to be prevented with the aid of the reinforcement structure, a good deformability of an edge area of the cantilevered area that surrounds the middle area is advantageous. Via the different distances of the reinforcement structure from the frame structure according to the present invention, the undesirable deformation of the middle area may be prevented and a good deformability of the edge area may be ensured. As discussed in greater detail below, the present invention thus contributes to providing capacitive pressure sensor devices having a high pressure sensitivity.

In one advantageous specific embodiment of the micromechanical component in accordance with the present invention, an edge area of the cantilevered area is definable which extends within the first distance from the frame structure in the first spatial direction, and extends within the second distance from the frame structure in the second spatial direction. The edge area of the cantilevered area is preferably kept away from the reinforcement structure. Thus, there is little or no impairment of a deformability of the edge area of the cantilevered area by the reinforcement structure.

The reinforcement structure preferably includes strip-shaped, cubically shaped, and/or circular sector-shaped reinforcement pieces. As explained in greater detail below, such a multipart design of the reinforcement structure advantageously contributes to prevention of a deformation of the middle area of the cantilevered area, and to improvement of a deformability of the edge area of the cantilevered area. However, it is pointed out here that the reinforcement structure may also have a one-part design.

In a further advantageous specific embodiment of the micromechanical component in accordance with the present invention, an inner volume that is enclosed by the frame structure and the diaphragm is sealed off air-tight with a reference pressure present therein, the cantilevered area of the diaphragm with the aid of a physical pressure, unequal to the reference pressure, on the outer side of the cantilevered area being deformable in such a way that a distance between a measuring electrode situated on the framed partial surface and the reinforcement structure formed at the inner side varies, and the measuring electrode and the reinforcement structure or a counter electrode that is fastened to the reinforcement structure being electrically contactable in such a way that a measuring voltage present between the measuring electrode and the reinforcement structure or the counter electrode is tappable. The specific embodiment of the micromechanical component described here is advantageously suited for use as part of a capacitive pressure sensor device.

In accordance with an example embodiment of the present invention, a capacitive pressure sensor device is advantageous that includes the micromechanical component described in the preceding paragraph, and evaluation electronics that are designed to establish and output a measured value with regard to the physical pressure prevailing in each case on the outer side of the cantilevered area, at least taking the tapped measuring voltage into account. The capacitive pressure sensor device is well suited for establishing the measured value with a relatively high measuring accuracy and a comparatively low error rate.

In addition, carrying out a corresponding manufacturing method for a micromechanical component for a capacitive pressure sensor device may yield the advantages described above. It is pointed out that the manufacturing method according to the specific embodiments of micromechanical components explained above may be refined.

Furthermore, carrying out a corresponding method for manufacturing a capacitive pressure sensor device may provide the advantages described above. Moreover, the method for manufacturing a capacitive pressure sensor device may be refined.

BRIEF DESCRIPTION OF THE DRAWINGS

Further features, advantages, and example embodiments of the present invention are explained below with reference to the figures.

DETAILED DESCRIPTION OF EXAMPLE EMBODIMENTS

Figure 1A:
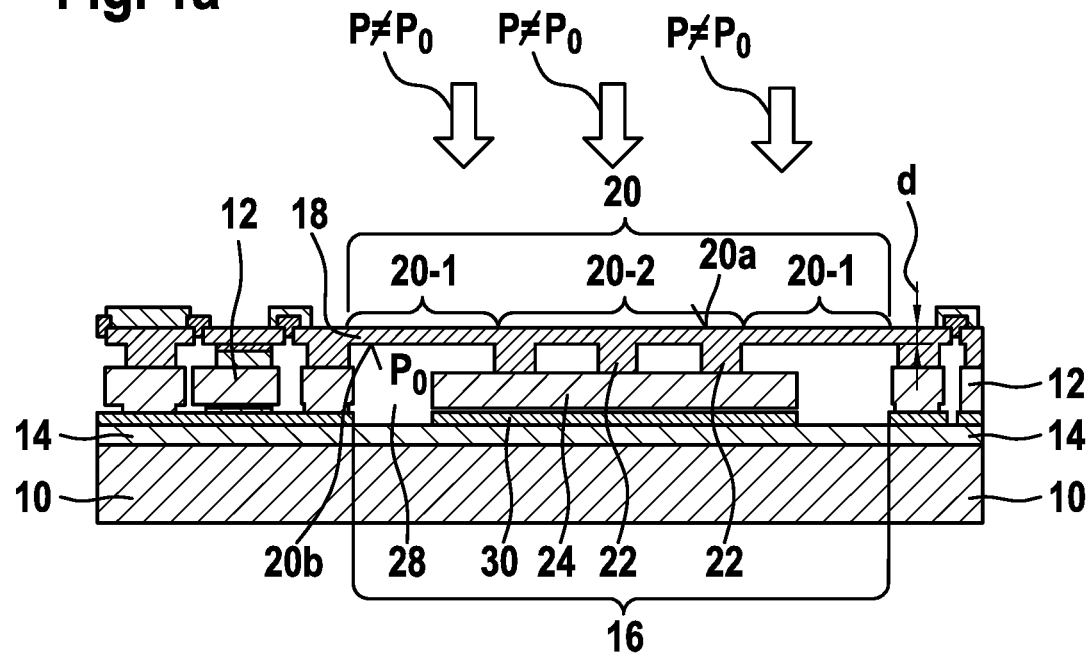
FIGS. 1a and 1b show schematic illustrations of a first specific embodiment of the micromechanical component in accordance with the present invention.
Figure 1B:
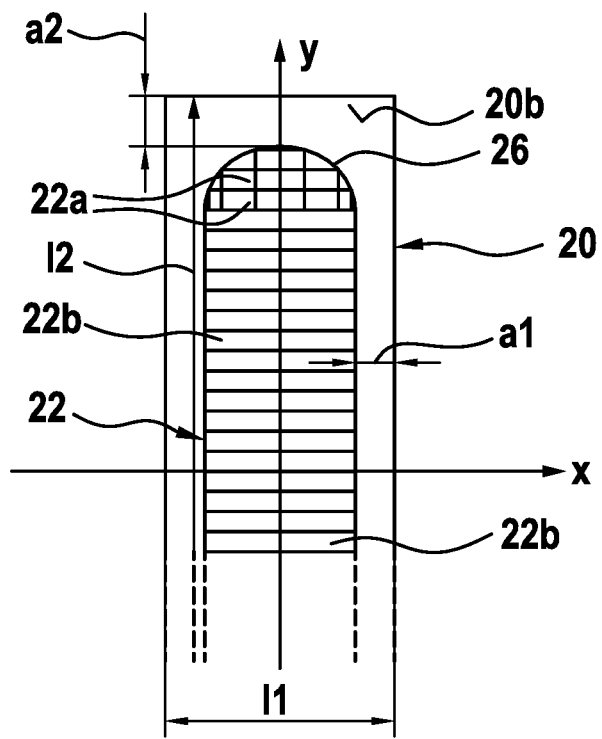

FIGS. 1a and 1b show schematic illustrations of a first specific embodiment of the micromechanical component.

The micromechanical component illustrated in cross section in FIG. 1a includes a substrate 10 that preferably includes at least one semiconductor material. Substrate 10 may be a silicon substrate, for example. However, it is pointed out here that substrate 10 may include at least one further material instead of or in addition to silicon.

The micromechanical component also includes a frame structure 12, which on a substrate side 10a of substrate 10 or at least one intermediate layer 14 present on substrate 10 is designed in such a way that frame structure 12 frames a partial surface 16 of substrate 10 and/or of the at least one intermediate layer 14. For example, frame structure 12 may be formed as an intermediate layer 14, on an insulating layer 14 that covers substrate side 10a. Intermediate layer 14 may also include multiple sublayers, for example a silicon oxide layer and a (silicon-rich) silicon nitride layer.

With the aid of frame structure 12, a diaphragm/diaphragm layer 18 is stretched in such a way that a cantilevered area 20 of diaphragm 18 spans framed partial surface 16. Diaphragm 18 may include at least one semiconductor material, for example silicon. However, it is pointed out that diaphragm 18 may include at least one further material instead of or in addition to silicon.

Cantilevered area 20 includes a one-part or multipart reinforcement structure 22 that is formed at an outer side 20a of cantilevered area 20 directed away from framed partial surface 16 or at an inner side 20b of cantilevered area 20 oriented toward framed partial surface 16. Reinforcement structure 22 may be understood in particular to mean a "local thickening" of cantilevered area 20 in a direction oriented perpendicularly with respect to outer side 20a and/or inner side 20b, compared to a minimal layer thickness d of cantilevered area 20 perpendicular to outer side 20a and/or inner side 20b. In the example in FIGS. 1a and 1b, reinforcement structure 22 is formed at inner side 20b of cantilevered area 20. In this case a counter electrode 24 whose function is described below may optionally be fastened to reinforcement structure 22. In addition to reinforcement structure 22 formed at inner side 20b, it is optionally possible to form yet a further surface structure at outer side 20a.

FIG. 1b shows inner side 20b of cantilevered area 20 together with reinforcement structure 22 formed thereon, in a top view. It is apparent in FIG. 1b that for cantilevered area 20, a first spatial direction x oriented in parallel to framed partial surface 16 is definable in which cantilevered area 20 has a minimal extension I1, referred to in the following as first extension I1 of cantilevered area 20. In addition, a second spatial direction y oriented in parallel to framed partial surface 16 and perpendicularly with respect to first spatial direction x is definable in which cantilevered area 20 has a greater second extension I2 compared to first extension I1. (In FIG. 1b, first spatial direction x and second spatial direction y each extend centrally through cantilevered area 20.) Cantilevered area 20 with different extensions I1 and I2 in the various spatial directions x and y may have, for example, rectangular outer and inner sides 20a and 20b or elliptical outer and inner sides 20a and 20b. However, it is pointed out that outer and inner sides 20a and 20b of cantilevered area 20 with different extensions I1 and I2 may have (virtually) any shape.

It is also apparent in FIG. 1b that reinforcement structure 22 is present at a first distance a1 from frame structure 12 in first spatial direction x, and is present at a second distance a2 from frame structure 12 in second spatial direction y, second distance a2 of reinforcement structure 22 from frame structure 12 in second spatial direction y being greater than first distance a1 of reinforcement structure 22 from frame structure 12 in first spatial direction x.

Different distances a1 and a2 of reinforcement structure 22 from frame structure 12 in the various spatial directions x and y allow good deformability of cantilevered area 20. In particular, reinforcement structure 22 is thus adapted to different extensions I1 and I2 of cantilevered area 20 in the various spatial directions x and y. Despite the deviation of the shape of cantilevered area 20 from a circular shape, maintaining different distances a1 and a2 of reinforcement structure 22 from frame structure 12 allows a deformability of cantilevered area 20 that is (almost) like that for a circular cantilevered area. As explained in greater detail below, cantilevered area 20 of diaphragm 18 may thus be advantageously used for carrying out measurements, such as pressure measurements in particular.

For cantilevered area 20, an edge area 20-1 of cantilevered area 20 is definable which extends within first distance a1 from frame structure 12 in first spatial direction x, and within second distance a2 from frame structure 12 in second spatial direction y. As is apparent in FIGS. 1a and 1b, edge area 20-1 of cantilevered area 20 is kept away from reinforcement structure 22. Reinforcement structure 22 is thus formed solely at a middle area 20-2 of cantilevered area 20 that is surrounded by edge area 20-1 of cantilevered area 20. Edge area 20-1 of cantilevered area 20 preferably has only minimal layer thickness d of cantilevered area 20 perpendicular to outer side 20a and/or inner side 20b.

The formation of reinforcement structure 22 solely at middle area 20-2 of cantilevered area 20 effectuates the desired reinforcement of middle area 20-2, while at the same time a good deformability/bendability of edge area 20-1 is maintained. This is advantageous, since when cantilevered area 20 is used to carry out a measurement, in particular a pressure measurement, a good deformability of edge area 20-1 of cantilevered area 20 as a response to a change in at least one variable to be measured is often desired, while at the same time, the reinforcement of middle area 20-2 of cantilevered area 20 facilitates carrying out the particular measurement. This advantage is reliably ensured by maintaining different distances a1 and a2 of reinforcement structure 22 from frame structure 12 in the various spatial directions x and y.

As is apparent in FIG. 1b, for reinforcement structure 22 a lateral area 26 may be definable which surrounds reinforcement structure 22 in spatial directions x and y, outer surfaces of reinforcement structure 22 being situated within lateral area 26. Lateral area 26 may in particular have an elliptical cross section in parallel to outer side 20a and/or inner side 20b (cf. FIG. 1b). With the aid of such a design of reinforcement structure 22, a maximum deformability of cantilevered area 20, and thus a maximum sensitivity of a capacitive sensor, for example a capacitive pressure sensor, that is equipped with the micromechanical component described here may be achieved.

Reinforcement structure 22 may be understood to mean a one-part reinforcement structure 22. Likewise, the reinforcement structure may also have a multipart design, i.e., formed from individual reinforcement pieces 22a through 22c. Reinforcement structure 22 may include, for example, strip-shaped, cubically shaped, and/or circular sector-shaped reinforcement pieces 22a through 22c. However, reinforcement pieces 22a through 22c of reinforcement structure 22 may also have other shapes.

In the example in FIGS. 1a and 1b, reinforcement structure 22 extends in second spatial direction y from an illustrated first outer end to a second outer end (not shown). At both outer ends, reinforcement structure 22 in each case includes cubically shaped reinforcement pieces 22a, while strip-shaped reinforcement pieces 22b are situated between the outer ends of reinforcement structure 22 that are formed from cubically shaped reinforcement pieces 22a. Strip-shaped reinforcement pieces 22b extend in parallel to first spatial direction x. The configuration of reinforcement structure 22 described here, made up of reinforcement pieces 22a and 22b, additionally improves a deformability of cantilevered area 20.

The specific embodiment in FIGS. 1a and 1b also includes, by way of example, counter electrode 24 that is fastened to reinforcement structure 22. However, it is also pointed out that reinforcement structure 22 may already fulfill the function of counter electrode 24 described below. In addition, the one-part design of counter electrode 24 is to be interpreted only as an example. Thus, counter electrode 24 may also include multiple partial electrodes that are fastened to cantilevered area 20 with the aid of multiple reinforcement pieces 22a through 22c. The partial electrodes may also have a strip-shaped, cubically shaped, and/or circular sector-shaped design.

The micromechanical component illustrated with the aid of FIGS. 1a and 1b has an inner volume 28, enclosed and sealed off air-tight by frame structure 12 and diaphragm 18, with a reference pressure $p_0$ present therein. Cantilevered area 20 of diaphragm 18, with the aid of a physical pressure p, unequal to reference pressure $p_0$, on outer side 20a of cantilevered area 20 is deformable in such a way that a distance between a measuring electrode 30 situated on framed partial surface 16 and counter electrode 24 (or reinforcement structure 22 used as counter electrode 24) varies. Measuring electrode 30 and counter electrode 24 (or reinforcement structure 22) are electrically contactable in such a way that a measuring voltage present between measuring electrode 30 and counter electrode 24 is tappable. The difference between physical pressure p on outer side 20a of cantilevered area 20 and known reference pressure $p_0$, and thus physical pressure p, may thus be established by tapping the measuring voltage between measuring electrode 30 and counter electrode 24 and correspondingly evaluating the tapped measuring voltage.

FIGS. 2 through 7 show schematic illustrations of second through seventh specific embodiments of the micromechanical component.

FIGS. 2 through 7 each show inner side 20b of cantilevered area 20 of the particular micromechanical component together with reinforcement structure 22 formed thereon. In all specific embodiments in FIGS. 2 through 7, reinforcement structure 22 extends in second spatial direction y from an illustrated first outer end to a second outer end (not shown).

Figure 2:
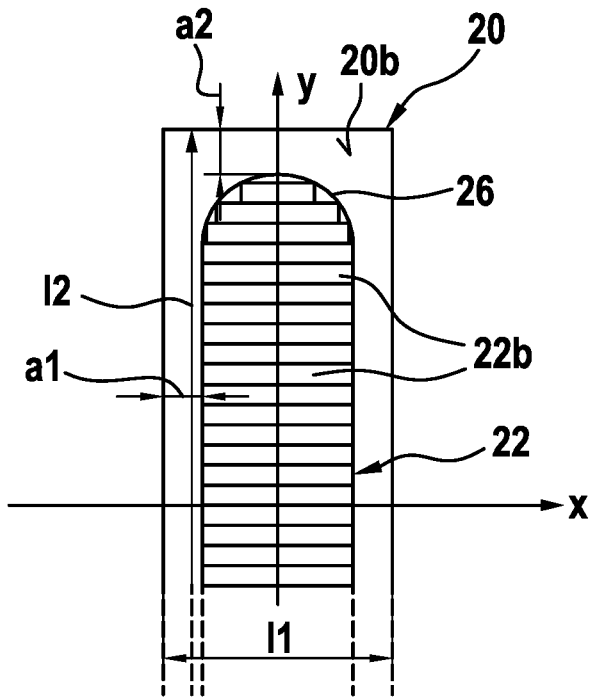
FIGS. 2 through 7 show schematic illustrations of second through seventh specific embodiments of the micromechanical component, in accordance with the present invention.

Reinforcement structure 22 in FIG. 2 includes only strip-shaped reinforcement pieces 22b that extend in parallel to first spatial direction x. However, the lengths of strip-shaped reinforcement pieces 22b become shorter in the direction toward the first outer end and the second outer end, so that a lateral area 26 surrounding reinforcement structure 22 in spatial directions x and y, having an elliptical cross section in parallel to outer side 20a and/or inner side 20b, is definable, outer surfaces of reinforcement structure 22 being situated within lateral area 26.

Figure 3:
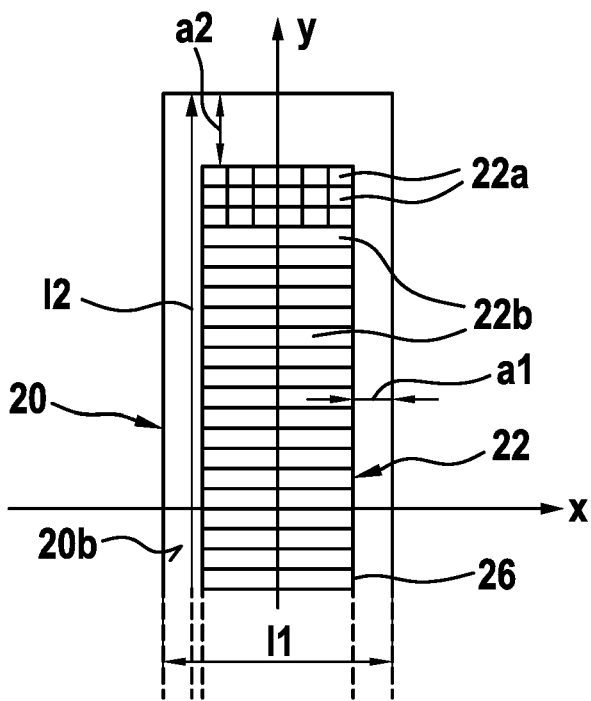

In reinforcement structure 22 shown in FIG. 3, the two outer ends are in each case formed from cubically shaped reinforcement pieces 22a. Strip-shaped reinforcement pieces 22b that extend in parallel to first spatial direction x are situated between the outer ends of reinforcement structure 22. Lateral area 26 of reinforcement structure 22 in FIG. 3, within which outer surfaces of reinforcement structure 22 are situated, has a rectangular cross section in parallel to outer side 20a and/or inner side 20b.

Figure 4:
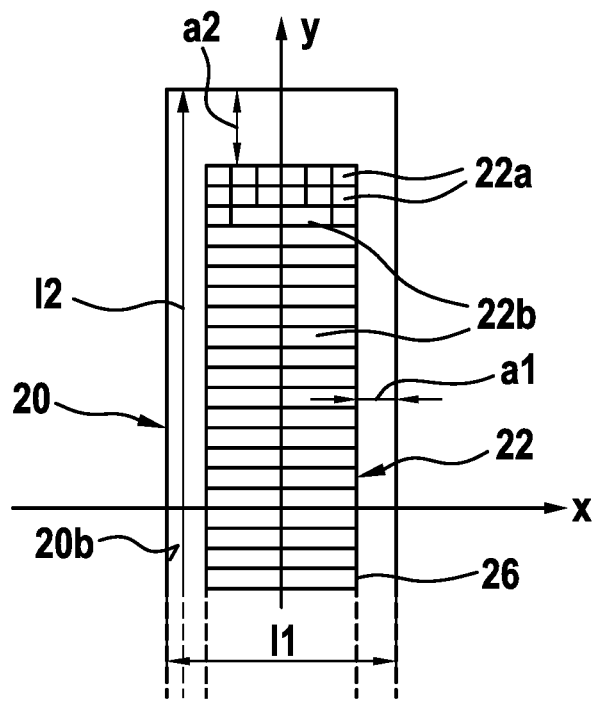

Also for reinforcement structure 22 in FIG. 4, a lateral area 26 is definable within which outer surfaces of reinforcement structure 22 are situated, and which likewise has a rectangular cross section in parallel to outer side 20a and/or inner side 20b. Reinforcement structure 22 in FIG. 3 includes strip-shaped reinforcement pieces 22b that extend in parallel to first spatial direction x, the lengths of strip-shaped reinforcement pieces 22b becoming shorter in the direction toward the first outer end and the second outer end. Lateral area 26 including rectangular cross section in parallel to outer side 20a and/or inner side 20b is therefore "filled up" with cubically shaped reinforcement pieces 22a at the two outer ends.

Figure 5:
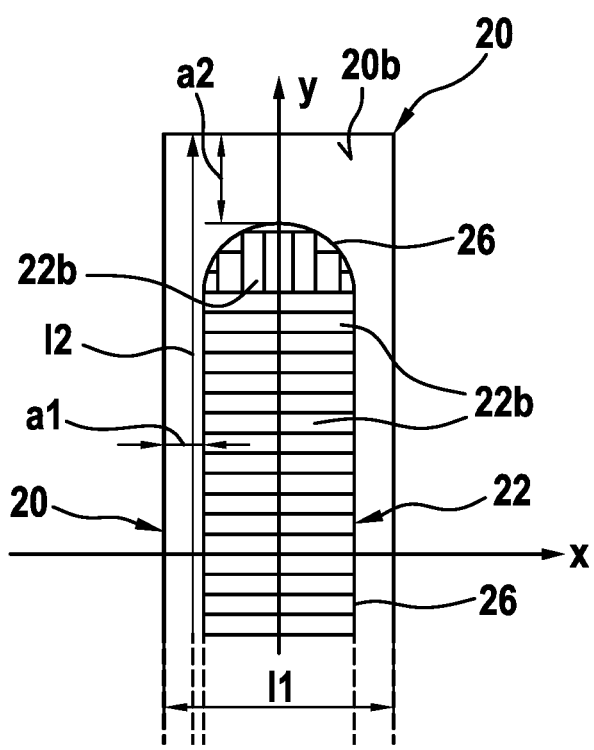

In reinforcement structure 22 shown in FIG. 5, the two outer ends are in each case formed from strip-shaped reinforcement pieces 22b that extend in parallel to second spatial direction y. Strip-shaped reinforcement pieces 22b that extend in parallel to first spatial direction x are situated between the outer ends of reinforcement structure 22. Strip-shaped reinforcement pieces 22b extending in parallel to second spatial direction y become longer in the direction toward second spatial direction y, so that lateral area 26 of reinforcement structure 22 within which outer surfaces of reinforcement structure 22 are situated has an elliptical cross section in parallel to outer side 20a and/or inner side 20b.

Figure 6:
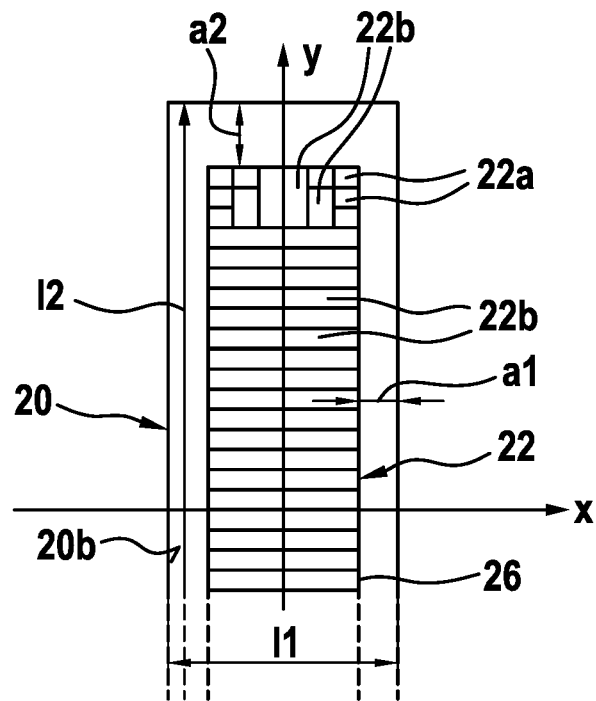

In contrast, for the reinforcement structure in FIG. 6 a lateral area 26 within which outer surfaces of reinforcement structure 22 are situated is definable which has a rectangular cross section in parallel to outer side 20a and/or inner side 20b, although the reinforcement structure in FIG. 6 also includes strip-shaped reinforcement pieces 22b at its outer ends which extend in parallel to first spatial direction x, and which become longer in the direction toward second spatial direction y. (Strip-shaped reinforcement pieces 22b that extend in parallel to first spatial direction x are situated between the outer ends of reinforcement structure 22 in FIG. 6.) Lateral area 26 is therefore "filled up" with cubically shaped reinforcement pieces 22a at the two outer ends.

Figure 7:
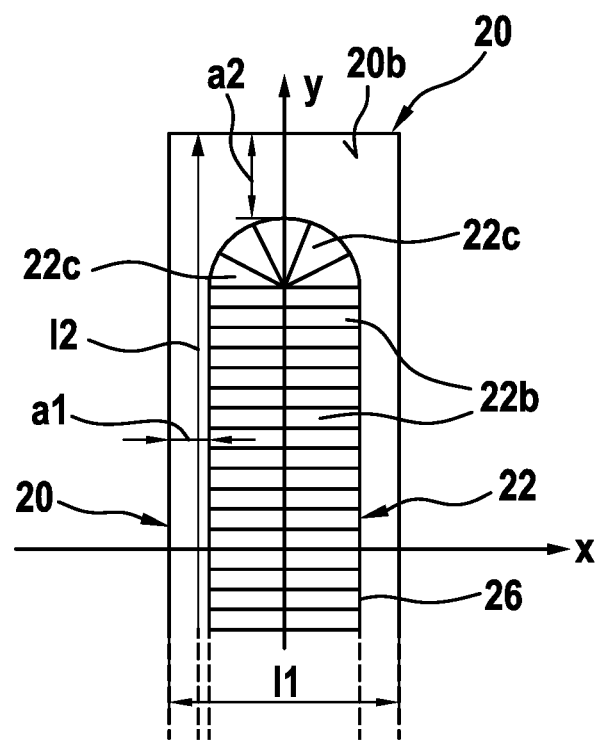

Reinforcement structure 22 shown in FIG. 7 has outer ends that are formed from circular sector-shaped reinforcement pieces 22c. Strip-shaped reinforcement pieces 22b that extend in parallel to first spatial direction x are situated between the outer ends of reinforcement structure 22 in FIG.

7. Circular sector-shaped reinforcement pieces 22c are oriented in such a way that for the reinforcement structure in FIG. 7, a lateral area 26 is definable within which outer surfaces of reinforcement structure 22 are situated, and which has an elliptical cross section in parallel to outer side 20a and/or inner side 20b.

With regard to further features of the micromechanical components schematically illustrated in FIGS. 2 through 7, reference is made to the preceding specific embodiment.

Figure 8A:
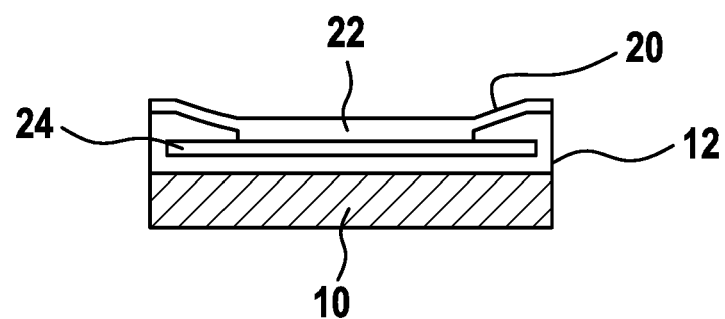
FIGS. 8a and 8b show schematic illustrations of an eighth specific embodiment of the micromechanical component, in accordance with the present invention.
Figure 8B:
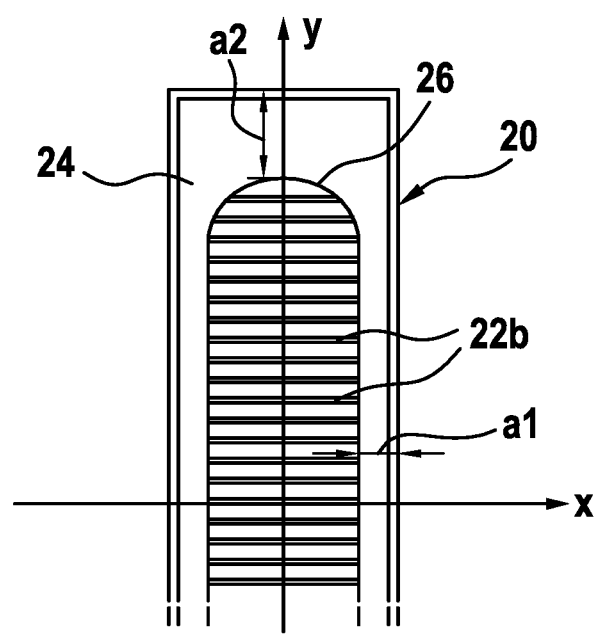

FIGS. 8a and 8b show schematic illustrations of an eighth specific embodiment of the micromechanical component.

The specific embodiment described here is shown in cross section in FIG. 8a. FIG. 8b shows inner side 20b of cantilevered area 20 of the micromechanical component together with reinforcement structure 22 formed thereon, which is the same as reinforcement structure 22 in FIG. 2. Based on FIGS. 8a and 8b, it is apparent that reinforcement structure 22, due to its different distances a1 and a2 from frame structure 12 in the various spatial directions x and y, may be utilized for suspending a comparatively large-surface counter electrode 24 on cantilevered area 20; cantilevered area 20 maintains a good deformability despite relatively large-surface counter electrode 24. The good deformability of cantilevered area 20/its edge area 20-1 as a response to a change in at least one variable may be utilized for carrying out a measurement of the particular variable. Comparatively large-surface counter electrode 24 (and possibly, likewise relatively large-surface measuring electrode 30) improve a measuring accuracy of the particular measurement.

With regard to further features of the micromechanical component schematically illustrated in FIGS. 8a and 8b, reference is made to the preceding specific embodiments.

Figure 9:
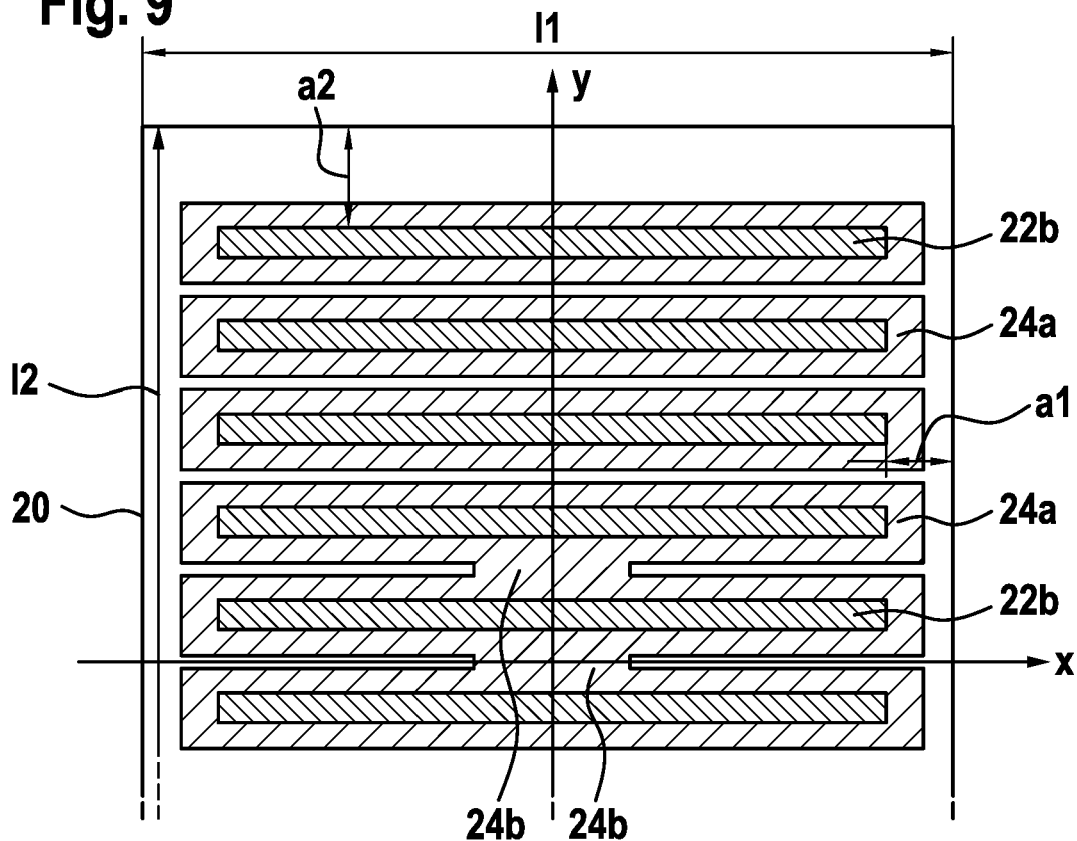
FIGS. 9 through 11 show schematic illustrations of ninth through eleventh specific embodiments of the micromechanical component, in accordance with the present invention.
Figure 10:
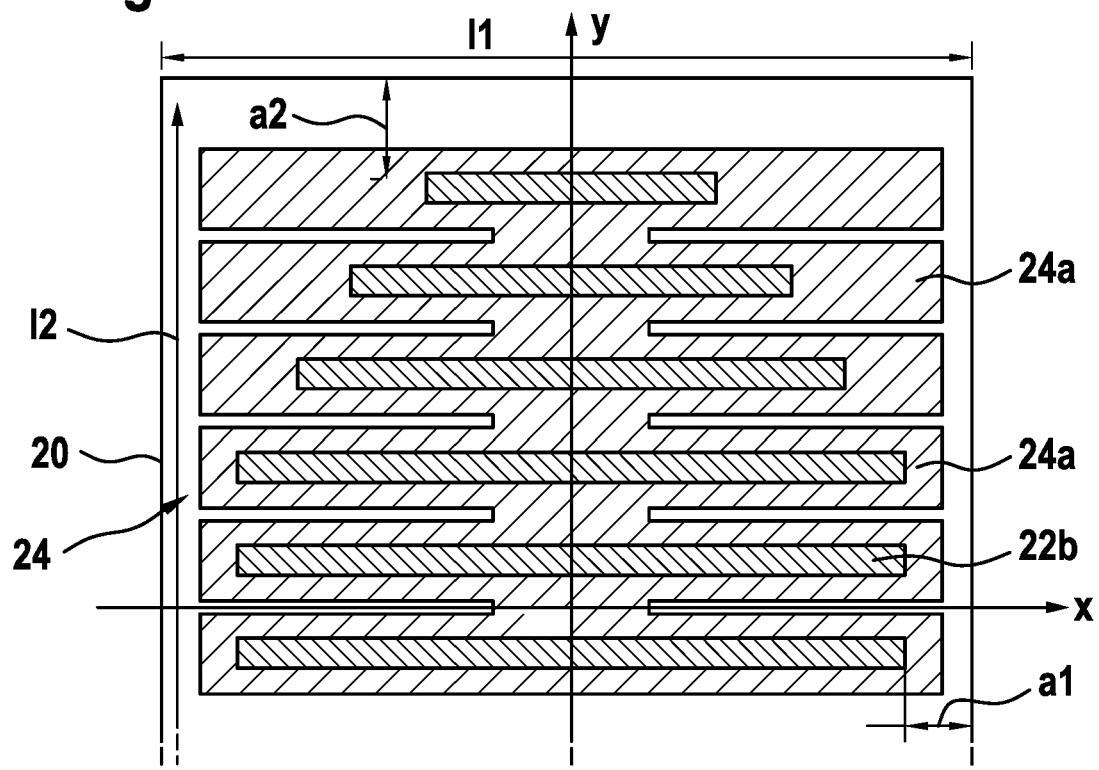
Figure 11:
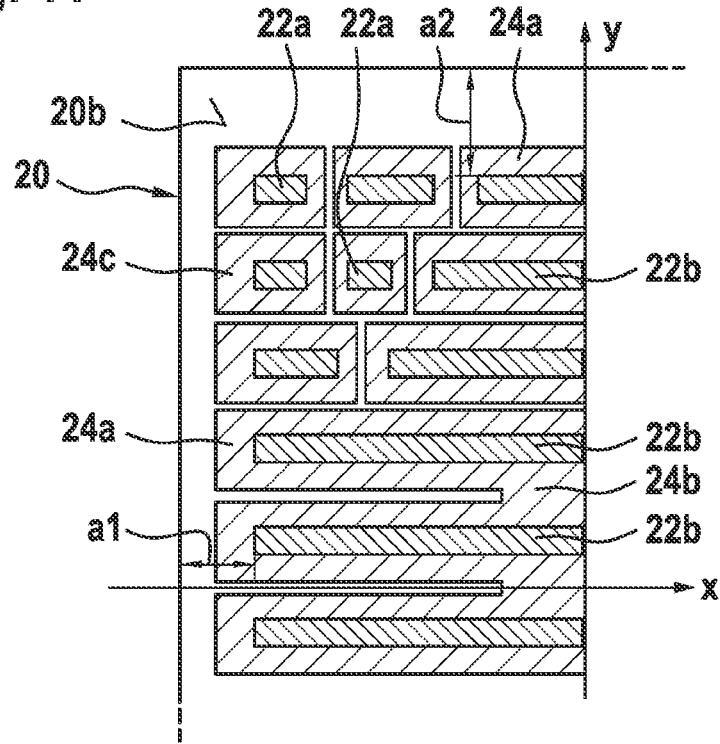

FIGS. 9 through 11 show schematic illustrations of ninth through eleventh specific embodiments of the micromechanical component.

FIGS. 9 through 11 show top views onto counter electrode 24 of the particular micromechanical component, the counter electrode being suspended at inner side 20b of cantilevered area 20 via associated reinforcement structure 22. Particular counter electrode 24 includes multiple strip-shaped partial electrodes 24a that extend in parallel to first spatial direction x. In addition, in all specific embodiments, counter electrode 24 extends in second spatial direction y from an illustrated first outer electrode end to a second outer electrode end (not shown).

In the specific embodiment in FIG. 9, the outer electrode ends each include multiple (three, for example) strip-shaped partial electrodes 24a that extend in parallel to first spatial direction x and that are not connected to one another. Strip-shaped partial electrodes 24a situated between the outer electrode ends are connected to one another in each case via a connecting area 24b that extends along second spatial direction y.

In contrast, all strip-shaped partial electrodes 24a of counter electrode 24 in FIG. 10 are connected to one another in each case via a connecting area 24b that extends along second spatial direction y.

In the specific embodiment in FIG. 11, strip-shaped partial electrodes 24a become shorter in the direction toward the outer ends. However, cubically shaped partial electrodes 24c may optionally also be situated at the ends of "shortened" strip-shaped partial electrodes 24a to effectuate a comparatively large-surface design of counter electrode 24, despite the subdivision of counter electrode 24 into multiple partial electrodes 24a through 24c.

With regard to further features of the micromechanical components schematically illustrated in FIGS. 9 through 11, reference is made to the preceding specific embodiments.

All micromechanical components described above may in each case be advantageously used in a capacitive sensor device, for example a capacitive pressure sensor device. Such a capacitive pressure sensor device preferably includes, in addition to the particular micromechanical component, evaluation electronics that are designed to establish and output a measured value with regard to physical pressure p prevailing in each case on outer side 20a of cantilevered area 20, at least taking the tapped measuring voltage into account.

Figure 12:
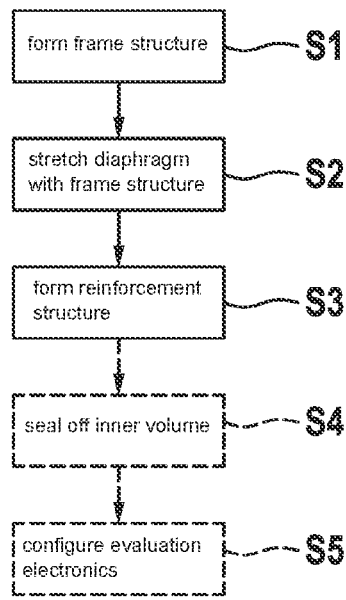
FIG. 12 shows a flowchart for explaining one specific embodiment of the manufacturing method for a micromechanical component for a capacitive pressure sensor device, in accordance with the present invention.

FIG. 12 shows a flowchart for explaining one specific embodiment of the manufacturing method for a micromechanical component for a capacitive pressure sensor device.

The manufacturing method described below may be designed, for example, for manufacturing one of the micromechanical components described above.

However, practicability of the manufacturing method is not limited to the manufacture of these micromechanical components.

A frame structure is formed on and/or at a substrate in a method step S1 in such a way that the frame structure frames a partial surface of the substrate and/or at least one intermediate layer that is present on the substrate. As method step S2, a diaphragm is stretched with the aid of the frame structure in such a way that a cantilevered area of the diaphragm spans the framed partial surface, a first spatial direction oriented in parallel to the framed partial surface being definable in which the cantilevered area has a minimal extension, and a second spatial direction oriented in parallel to the framed partial surface and perpendicularly with respect to the first spatial direction being definable in which the cantilevered area has a greater extension compared to the minimal extension.

As method step S3, a one-part or multipart reinforcement structure is also formed at an outer side of the cantilevered area directed away from the framed partial surface, or at an inner side of the cantilevered area oriented toward the framed partial surface. The reinforcement structure is formed at a first distance from the frame structure in the first spatial direction, and at a second distance from the frame structure in the second spatial direction, the second distance being greater than the first distance. Carrying out the manufacturing method described here thus also yields the advantages already explained above.

In particular, an edge area of the cantilevered area may be definable which extends within the first distance from the frame structure in the first spatial direction, and within the second distance from the frame structure in the second spatial direction, the edge area of the cantilevered area being kept away from the reinforcement structure. The reinforcement structure may likewise be formed from strip-shaped, cubically shaped, and/or circular sector-shaped reinforcement pieces.

As optional method step S4, an inner volume that is enclosed by the frame structure and the diaphragm may additionally be sealed off air-tight with a reference pressure present therein in such a way that the cantilevered area of the diaphragm with the aid of a physical pressure, unequal to the reference pressure, on the outer side of the cantilevered area is deformable in such a way that a distance between a measuring electrode situated on the framed partial surface and the reinforcement structure formed at the inner side varies. In addition, the measuring electrode and the reinforcement structure or a counter electrode that is fastened to the reinforcement structure may be designed to be electrically contactable in such a way that a measuring voltage present between the measuring electrode and the reinforcement structure or the counter electrode is tappable.

The manufacturing method described here may also be part of a method for manufacturing a capacitive pressure sensor device. In this case, an optional method step S5 is also carried out, in which evaluation electronics are designed in such a way that the evaluation electronics establish and output a measured value with regard to the physical pressure that prevails in each case on the outer side of the cantilevered area, at least taking the tapped measuring voltage into account.

Method steps S1 through S5 explained above may be carried out in (virtually) any order and/or at the same time, at least in part.

What is claimed is:

1. A micromechanical component for a capacitive pressure sensor device, comprising:
   a substrate;
   a frame structure that frames a partial surface of the substrate and/or at least one intermediate layer that is present on the substrate;
   a diaphragm that is stretched using the frame structure in such a way that a cantilevered area of the diaphragm, with an outer side that is directed away from the partial surface and an inner side that is oriented toward the framed partial surface, spans the framed partial surface; and
   a reinforcement structure which, at the outer side of the cantilevered area or at the inner side of the cantilevered area, is configured as a local thickening of the cantilevered area in a direction oriented perpendicularly with respect to the outer side and/or the inner side, compared to a minimal layer thickness of the cantilevered area perpendicular to the outer side and/or the inner side;
   wherein a first spatial direction is a direction oriented in parallel to the framed partial surface in which the cantilevered area has a minimal extension, and a second spatial direction is a direction oriented in parallel to the framed partial surface and oriented perpendicularly with respect to the first spatial direction in which the cantilevered area has a greater extension compared to the minimal extension,
   wherein the reinforcement structure is present at a first distance from the frame structure in the first spatial direction, and at a second distance from the frame structure in the second spatial direction, the second distance being greater than the first distance, and
   wherein the reinforcement structure is a multipart reinforcement structure made up of individual reinforcement pieces.

2. The micromechanical component as recited in claim 1, wherein an edge area of the cantilevered area extends within the first distance from the frame structure in the first spatial direction, and extends within the second distance from the frame structure in the second spatial direction, and the edge area of the cantilevered area being kept away from the reinforcement structure.

3. The micromechanical component as recited in claim 1, wherein the reinforcement structure includes strip-shaped, and/or cubically shaped, and/or circular sector-shaped reinforcement pieces.

4. The micromechanical component as recited in claim 1, wherein an inner volume that is enclosed by the frame structure and the diaphragm is sealed off air-tight with a reference pressure present therein, the cantilevered area of the diaphragm with the aid of a physical pressure, unequal to the reference pressure, on the outer side of the cantilevered area being deformable in such a way that a distance between a measuring electrode situated on the framed partial surface and the reinforcement structure formed at the inner side varies, and the measuring electrode and the reinforcement structure or a counter electrode that is fastened to the reinforcement structure being electrically contactable in such a way that a measuring voltage present between the measuring electrode and the reinforcement structure or the counter electrode is tappable.

5. A capacitive pressure sensor device, comprising:
   a micromechanical component, including:
      a substrate;
      a frame structure that frames a partial surface of the substrate and/or at least one intermediate layer that is present on the substrate;
      a diaphragm that is stretched using the frame structure in such a way that a cantilevered area of the diaphragm, with an outer side that is directed away from the partial surface and an inner side that is oriented toward the framed partial surface, spans the framed partial surface; and
      a reinforcement structure which, at the outer side of the cantilevered area or at the inner side of the cantilevered area, is configured as a local thickening of the cantilevered area in a direction oriented perpendicularly with respect to the outer side and/or the inner side, compared to a minimal layer thickness of the cantilevered area perpendicular to the outer side and/or the inner side;
      wherein a first spatial direction is a direction oriented in parallel to the framed partial surface in which the cantilevered area has a minimal extension, and a second spatial direction is a direction oriented in parallel to the framed partial surface and oriented perpendicularly with respect to the first spatial direction in which the cantilevered area has a greater extension compared to the minimal extension,
      wherein the reinforcement structure is present at a first distance from the frame structure in the first spatial direction, and at a second distance from the frame structure in the second spatial direction, the second distance being greater than the first distance,
      wherein the reinforcement structure is a multipart reinforcement structure made up of individual reinforcement pieces, and
      wherein an inner volume that is enclosed by the frame structure and the diaphragm is sealed off air-tight with a reference pressure present therein, the cantilevered area of the diaphragm with the aid of a physical pressure, unequal to the reference pressure, on the outer side of the cantilevered area being deformable in such a way that a distance between a measuring electrode situated on the framed partial surface and the reinforcement structure formed at the inner side varies, and the measuring electrode and the reinforcement structure or a counter electrode that is fastened to the reinforcement structure being electrically contactable in such a way that a measuring voltage present between the measuring electrode and the reinforcement structure or the counter electrode is tappable; and
   evaluation electronics that are configured to establish and output a measured value with regard to the physical pressure prevailing in each case on the outer side of the cantilevered area, at least taking the tapped measuring voltage into account.

\* \* \* \* \*